US012747490B2

(12) United States Patent
You et al.

(10) Patent No.: US 12,747,490 B2
(45) Date of Patent: Sep. 29, 2026

(54) MASK ASSEMBLY AND DEPOSITION APPARATUS FOR DISPLAY DEVICE INCLUDING THE SAME

(71) Applicant: Samsung Display Co., LTD., Yongin-si (KR)

(72) Inventors: Suk Beom You, Anyang-si (KR); Kyongho Hong, Hwaseong-si (KR); Myungkyu Kim, Cheonan-si (KR); Chang-Kon Park, Cheonan-si (KR); Dongjae Lee, Cheonan-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 1077 days.

(21) Appl. No.: 17/865,027

(22) Filed: Jul. 14, 2022

(65) Prior Publication Data

US 2023/0161242 A1 May 25, 2023

(30) Foreign Application Priority Data

Nov. 24, 2021 (KR) ........................ 10-2021-0163244

(51) Int. Cl.
*C23C 14/04* (2006.01)
*H10K 71/00* (2023.01)
*H10K 71/16* (2023.01)

(52) U.S. Cl.
CPC ............ *C23C 14/042* (2013.01); *H10K 71/00* (2023.02); *H10K 71/166* (2023.02)

(58) Field of Classification Search
CPC .... H10K 71/166; C23C 14/042; C23C 14/04; C23C 14/044; C23C 16/04; C23C 16/042
See application file for complete search history.

(56) References Cited

U.S. PATENT DOCUMENTS

2015/0007767 A1* 1/2015 Ko ........................ B05C 21/005 118/504
2015/0101536 A1* 4/2015 Han ...................... C23C 14/042 118/721

(Continued)

FOREIGN PATENT DOCUMENTS

CN 218812024 U * 4/2023 ........... C23C 14/541
JP 2019-26926 2/2019

(Continued)

OTHER PUBLICATIONS

Enlish translation for KR 102082784.*
English translation of KR101102037.*

*Primary Examiner* — Aiden Lee
(74) *Attorney, Agent, or Firm* — CANTOR COLBURN LLP

(57) ABSTRACT

A mask assembly according to an embodiment includes a support frame including at least four sides, a first frame disposed on the support frame and extending in a first direction, a second frame disposed on the support frame and extending in a second direction intersecting the first direction, and a mask sheet disposed on the support frame and including at least one opening. At least a side of the support frame includes a first protruding portion disposed at a first edge of the side, a second protruding portion disposed at a second edge of the side, and a recess portion disposed between the first protruding portion and the second protruding portion.

20 Claims, 11 Drawing Sheets
(3 of 11 Drawing Sheet(s) Filed in Color)

(56) References Cited

U.S. PATENT DOCUMENTS

| | | | | |
|---|---|---|---|---|
| 2016/0310988 | A1* | 10/2016 | Lee | H01L 21/00 |
| 2018/0342676 | A1* | 11/2018 | Zhao | H10K 71/166 |
| 2019/0301001 | A1* | 10/2019 | Zhang | C23C 14/042 |
| 2020/0238297 | A1 | 7/2020 | Kihara et al. | |
| 2020/0251656 | A1* | 8/2020 | Kim | C23C 16/042 |
| 2021/0172047 | A1* | 6/2021 | Yang | C23C 14/042 |
| 2021/0313548 | A1* | 10/2021 | Lee | C23C 14/042 |
| 2022/0056573 | A1* | 2/2022 | Li | C23C 14/12 |
| 2022/0081753 | A1* | 3/2022 | Son | C23C 14/042 |
| 2022/0178016 | A1* | 6/2022 | Son | C23C 14/042 |
| 2023/0363245 | A1* | 11/2023 | Cho | C23C 14/568 |
| 2024/0093350 | A1* | 3/2024 | Hong | C23C 14/24 |

FOREIGN PATENT DOCUMENTS

| | | | | |
|---|---|---|---|---|
| KR | 20090052201 A | | 5/2009 | |
| KR | 101102037 B1 | * | 1/2012 | G03F 7/70925 |
| KR | 10-1319320 | | 10/2013 | |
| KR | 10-1820020 | | 1/2018 | |
| KR | 102082784 B1 | * | 3/2020 | H10K 59/00 |
| KR | 10-2130546 | | 7/2020 | |
| KR | 20200096877 A | | 8/2020 | |

* cited by examiner

MASK ASSEMBLY AND DEPOSITION APPARATUS FOR DISPLAY DEVICE INCLUDING THE SAME

CROSS-REFERENCE TO RELATED APPLICATION(S)

This application claims priority to and benefits of Korean Patent Application No. 10-2021-0163244 under 35 U.S.C. § 119, filed in the Korean Intellectual Property Office on Nov. 24, 2021, the entire contents of which are incorporated herein by reference.

BACKGROUND

1. Technical Field

The disclosure relates to a mask assembly and a deposition device for a display device, including the mask assembly.

2. Description of the Related Art

Various types of electronic devices are manufactured and sold, and are being developed in various forms such as mobile phones, tablets, and laptop PCs, which are portable electronic devices. These electronic devices may include a light emitting display panel that may display images.

The light emitting display panel may include light emitting elements. A mask pattern having openings may be aligned on a substrate, and a deposition object such as an emission layer may be provided to the substrate through the opening of the mask pattern to deposit a pattern of a desired shape on the substrate, thereby forming a light emitting element including an emission layer in a certain region on the substrate. Accordingly, the mask assembly must be very precisely aligned.

The above information disclosed in this Background section is only for enhancement of understanding of the background of the disclosure, and therefore it may contain information that does not form the prior art that is already known in this country to a person of ordinary skill in the art.

SUMMARY

Embodiments may provide a high-resolution and large-scaled mask assembly. Embodiments may provide a mask assembly that can form a more precise pattern by preventing deformation of the mask assembly in a vertical deposition process, and a deposition apparatus for a display device including the mask assembly.

A mask assembly according to an embodiment may include a support frame including at least four sides, a first frame disposed on the support frame and extending in a first direction, a second frame disposed on the support frame and extending in a second direction intersecting the first direction, and a mask sheet disposed on the support frame and including at least one opening. At least a side of the support frame may include a first protruding portion disposed at a first edge of the side, a second protruding portion disposed at a second edge of the side, and a recess portion disposed between the first protruding portion and the second protruding portion.

The first edge may be an inner side of the support frame, and the second edge may be an outer side of the support frame.

The first protruding portion may surround the inner side of the support frame.

The second protruding portion may be disposed on at least a part of the outer side of the support frame.

The second protruding portion may be disposed on two sides of the support frame, facing each other.

The second protruding portion may be disposed on at least a part of two sides of the support frame, facing each other.

A cross-section of at least one of the first protruding portion and the second protruding portion may have a tapered shape.

The first protruding portion may have a first cross-section inclined toward an opening of the support frame.

The second protruding portion may have a second cross-section, and an inclination direction of the first cross-section and an inclination direction of the second cross-section may intersect each other.

The mask assembly may be used in a vertical deposition process.

A deposition apparatus for a display device according to an embodiment may include a chamber in which a display substrate may be disposed, a mask assembly opposite to the display substrate in the chamber, and a deposition source opposite to the mask assembly in the chamber. The mask assembly may include a support frame that includes at least four sides, a first frame disposed on the support frame and extending in a first direction, a second frame disposed on the support frame and extending in a second direction intersecting the first direction, and a mask sheet disposed on the support frame and including at least one opening. At least a side of the support frame may include a first protruding portion disposed at a first edge of the side, a second protruding portion disposed at a second edge of one side, and a recess portion disposed between the first protruding portion and the second protruding portion.

The mask assembly may be disposed vertically in the chamber.

The first edge may be an inner side of the support frame, and the second edge may be an outer side of the support frame.

The first protruding portion may surround an inner side of the support frame.

The second protruding portion may be disposed on at least a part of the outer side of the support frame.

The second protruding portion may be disposed on two sides of the support frame, facing each other.

The second protruding portion may be disposed on at least a part of two sides of the support frame, facing each other.

At least one cross-section of the first protruding portion and the second protruding portion may have a tapered shape.

The first protruding portion may have a first cross-section inclined toward an opening of the support frame.

The second protruding portion may have a second cross-section, and an inclination direction of the first cross-section and an inclination direction of the second-cross section may intersect each other.

According to embodiments, it may be possible to provide a mask assembly for high resolution and large area. Embodiments may provide a mask assembly that can form a more precise pattern by preventing deformation of the mask assembly in a vertical deposition process, and a deposition apparatus for a display device including the same.

BRIEF DESCRIPTION OF THE DRAWINGS

The patent or application file contains at least one drawing executed in color. Copies of this patent or patent application publication with color drawings will be provided by the Office upon request and payment of the necessary fee.

DETAILED DESCRIPTION OF THE EMBODIMENTS

Figure 1:
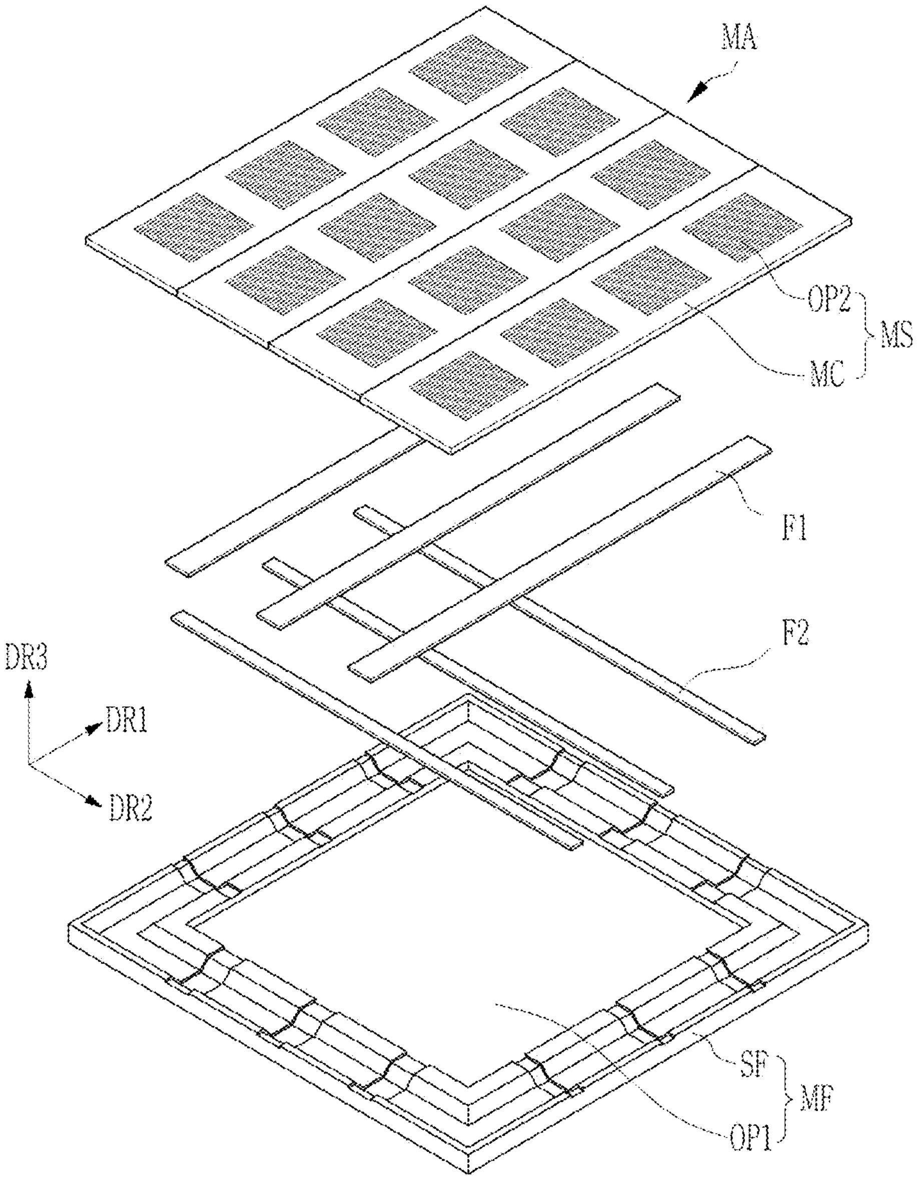
FIG. 1 is a schematic perspective view of a mask assembly according to an embodiment.

The disclosure will be described more fully hereinafter with reference to the accompanying drawings, in which embodiments of the disclosure are shown. As those skilled in the art would realize, the described embodiments may be modified in various different ways.

The drawings and description are to be regarded as illustrative in nature and not restrictive. Like reference numerals designate like elements throughout the specification. In some figures, directions (e.g., DR1, DR2, and DR3) are shown for reference and not limitation.

Since the size and thickness of each configuration shown in the drawings may be arbitrarily indicated for better understanding and ease of description, the disclosure is not necessarily limited to the drawings. In the drawings, the thickness of layers, films, panels, regions, etc., may be exaggerated for clarity. In the drawings, the thickness of some layers and regions may be exaggerated for better understanding and ease of description.

As used herein, the singular forms, "a," "an," and "the" are intended to include the plural forms as well, unless the context clearly indicates otherwise.

It will be understood that when an element such as a layer, film, region, or substrate is referred to as being "on" another element, it can be directly on the other element or intervening elements may also be present. In contrast, when an element is referred to as being "directly on" another element, there may be no intervening elements present. Further, throughout the specification, the word "on" a target element will be understood to mean positioned above or below the target element, and will not necessarily be understood to mean positioned "at an upper side" based on an opposite to gravity direction.

Unless explicitly described to the contrary, the words "comprise", "include", and "has", and variations such as "comprises", "comprising", "includes", "including", "have", and "having", will be understood to imply the inclusion of stated elements but not the exclusion of any other elements.

Further, throughout the specification, the phrase "in a plan view" means viewing a target portion from the top, and the phrase "on a cross-section" means viewing a cross-section formed by vertically cutting a target portion from a side.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as "not overlapping" or to "not overlap" another element, this may include that the elements are spaced apart from each other, offset from each other, or set aside from each other or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

It will be understood that the terms "connected to" or "coupled to" may include a physical or electrical connection or coupling. Further, a connection may be direct or indirect.

"About" or "approximately" or "substantially" as used herein are inclusive of the stated value and mean within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
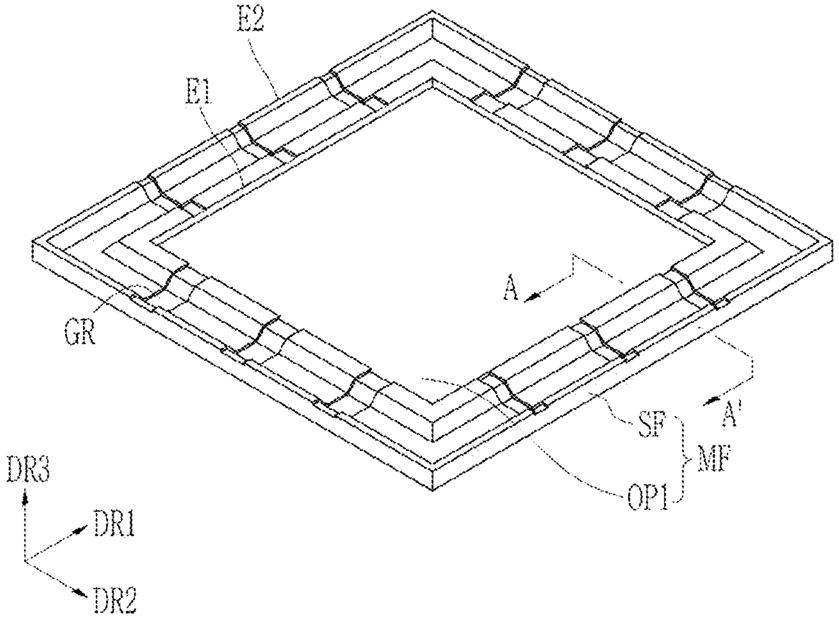
FIG. 2 is a schematic perspective view of a mask frame according to an embodiment.
Figure 3:
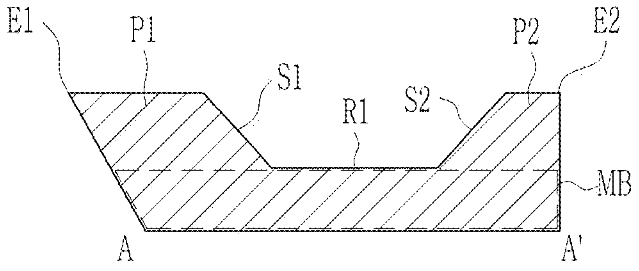
FIG. 3 is a schematic cross-sectional view of FIG. 2, taken along line A-A'.

Hereinafter, a mask assembly according to an embodiment will be described with reference to FIG. 1 to FIG. 3. FIG. 1 is a schematic perspective view of a mask assembly according to an embodiment, FIG. 2 is a schematic perspective view of a mask frame according to an embodiment, and FIG. 3 is a schematic cross-sectional view of FIG. 2, taken along line A-A'.

Referring to FIG. 1, a mask assembly MA according to an embodiment may include a mask frame MF including a first opening OP1 and a support frame SF, mask sheets MS extending in a first direction DR1 and coupled to the mask frame MF, and a first frame F1 and a second frame F2 that cross the first opening OP1. In an embodiment of the disclosure, it is described that multiple mask sheets MS may be stretched and coupled to the mask frame MF in the first direction DR1, but the mask sheet MS having an area corresponding to the first opening OP1 may be stretched in any one of the first direction DR1 and a second direction DR2 that may be perpendicular to the first direction DR1 or all directions.

The mask frame MF may surround the first opening OP1, and may include a support frame SF coupled with the mask sheet MS. For the support frame SF of the mask frame MF, a material with small deformation, that is, a metal material with high rigidity, may be used such that the ends of the mask sheet MS can be combined and fixed due to compressive force.

The mask sheet MS may include at least one second opening OP2 overlapping the first opening OP1, and a coupling portion MC that may be extended in the first direction DR1 and coupled to the support frame SF.

Here, the mask sheet MS may be a fine metal mask formed of a metal thin film, and may be formed by at least one of steel use stainless (SUS), invar, nickel, cobalt, and alloys thereof.

The first frame F1 and the second frame F2 may be positioned (disposed) to cross the first opening OP1 of the mask frame MF. The first frame F1 and the second frame F2 may prevent the mask sheet MS from being deformed. The first frame F1 may extend along the first direction DR1, and the second frame F2 may extend along the second direction DR2.

The first frame F1 and the second frame F2 may be coupled with the mask sheet MS between the second opening OP2 of the mask sheet MS. A coupling point between the first frame F1 and the second frame F2 and the mask sheet MS may be positioned between the second opening OP2. It may be possible to prevent the second opening OP2 of the mask sheet MS from being shielded by the bonding between the first frame F1 and the second frame F2 and the mask sheet MS.

The first frame F1, the second frame F2, and the mask sheet MS may be coupled through a fixing member (not shown), respectively, but is not limited thereto. The fixed member according to an embodiment may be disposed on the first frame F1, the second frame F2, and the support frame SF. The shape of the fixing member may be a cylinder shape, but is not limited thereto, and may be a pillar shape having various shapes such as a triangular pole, a square pole, and the like.

The first frame F1 and the second frame F2 may be provided with multiple positions spaced apart from each other. The cross-sections of the first frame F1 and second frame F2 may be circular, quadrangle, polygonal, or any other shape. The cross-section of the first frame F1 and the second frame F2 may be formed by polygons that contact the mask sheet MS and a certain area. In case that pressure is applied to the mask sheet MS, the support frame SF may be prevented from being damaged by the first frame F1 and the second frame F2, and the compatibility between the first frame F1 and the second frame F2 and the mask sheet MS can be increased.

The first frame F1 and the second frame F2 may be coupled with the support frame SF through a groove GR (refer to FIG. 2) formed in the support frame SF. The support frame SF may include a groove GR for accommodating the ends of the first frame F1 and the second frame F2. The depth of the groove GR may be substantially equivalent to or greater than a thickness of the first frame F1 and the second frame F2. However, embodiments are not so limited, and the first frame F1 and the second frame F2 may be coupled to the support frame SF through various methods, and the groove GR may be omitted.

Hereinafter, referring to FIG. 2 and FIG. 3, the mask frame MF according to an embodiment will be described in more detail.

The support frame SF may include a first edge E1 and a second edge E2 in a plan view. The first edge E1 may form an inner side of the support frame SF, and the second edge E2 may form an outer side of the support frame SF.

Referring to FIG. 3, the support frame SF may include a first protruding portion P1 and a second protruding portion P2. The first protruding portion P1 may be positioned along the first edge E1. The first protruding portion P1 may be surrounded along the inner side of the support frame SF.

The first cross-section S1 of the first protruding portion P1 may have a tapered shape. The first protruding portion P1 may have a shape inclined toward the first opening OP1, but is not limited thereto.

The second protruding portion P2 may overlap at least a portion of the second edge E2. The second protruding portion P2 may surround the outer side of the support frame SF along the second edge E2. The second cross-section S2 of the second protruding portion P2 may have a tapered shape. The second cross-section S2 of the second protruding portion P2 may be inclined in a direction opposite to that of the first cross-section S1.

The support frame SF may include a recess portion R1 positioned between the first protruding portion P1 and the second protruding portion P2. The support frame SF may include a main body MB, and the first protruding portion P1 and the second protruding portion P2 protruded from the main body. The main body MB exposed between the first protruding portion P1 and the second protruding portion P2 may form the recess portion R1.

The main body MB, the first protruding portion P1, and the second protruding portion P2 may be integral with each other (e.g., integrally formed,) but embodiments are not limited thereto. The main body MB and the first protruding portion P1 may be integral with each other, and the second protruding portion P2 may be separately coupled. In other embodiments, the first protruding portion P1 and the second protruding portion P2 may be separately coupled to the main body MB.

The mask assembly MA according to an embodiment may be provided vertically when used in a deposition apparatus for a display device. In case that a mask assembly with a weight is provided vertically, deflection or deformation of the mask assembly may be expected. However, the mask assembly MA according to an embodiment may prevent the deformation of the mask frame MF by including the first protruding portion P1 positioned on the inner side of the support frame SF and the second protruding portion P2 positioned on the outer side of the support frame SF. Thus, the mask assembly can be precisely aligned, and thus the formation of a fine pattern may be possible.

Figure 4:
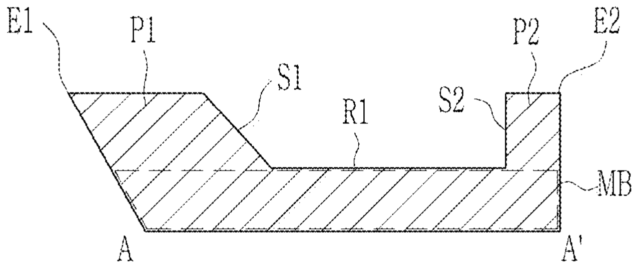
FIG. 4 is a schematic cross-sectional view of FIG. 2, taken along line A-A'.
Figure 5:
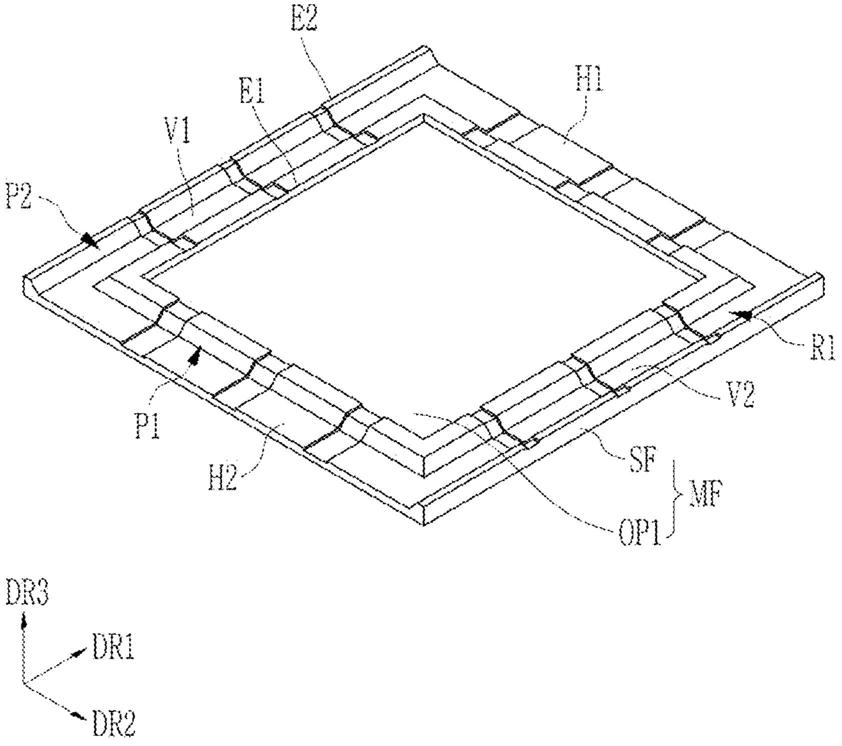
FIG. 5 and FIG. 6 are schematic perspective views of mask frames according to embodiments, respectively.
Figure 6:
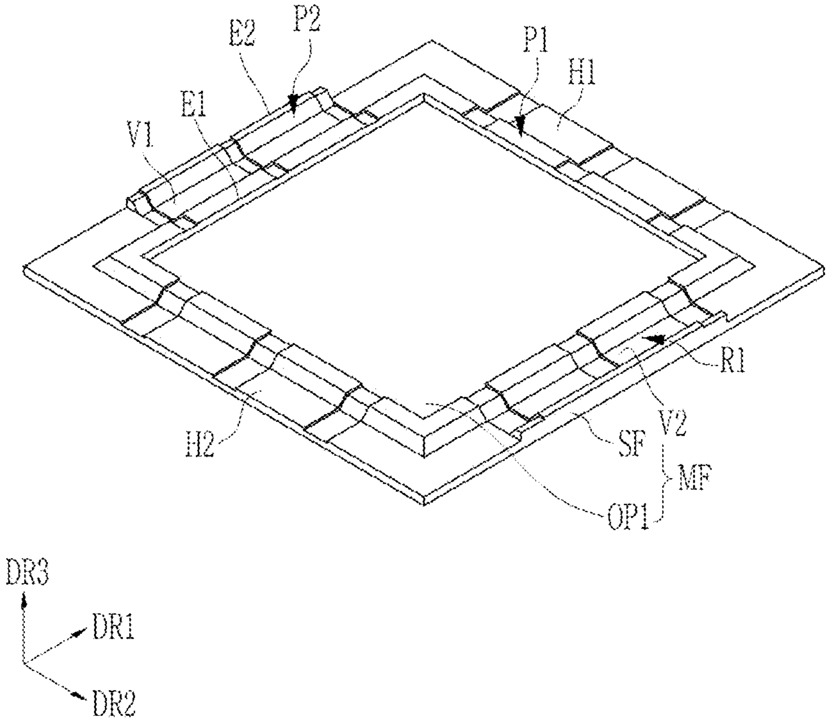
Figure 7:
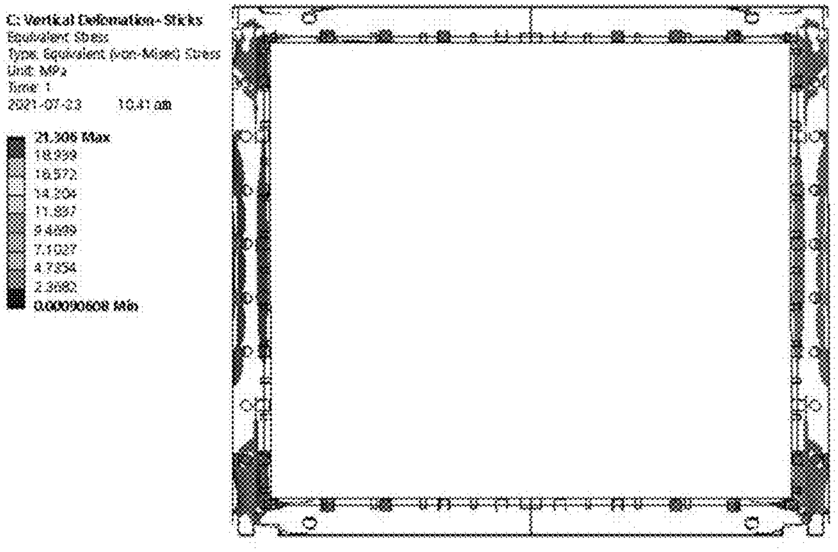
FIG. 7 is a schematic simulation image of a mask frame according to an embodiment.

Hereinafter, a mask assembly according to an embodiment will be described with reference to FIG. 4 to FIG. 7. FIG. 4 is a schematic cross-sectional view of FIG. 2, taken along line A-A', FIG. 5 and FIG. 6 are respectively schematic perspective views of mask frames according to embodiments, and FIG. 7 is a schematic simulation image of the mask frame according to an embodiment.

Referring to FIG. 4, a support frame SF may include a first protruding portion P1 and a second protruding portion P2. The first protruding portion P1 may be positioned along a first edge E1. The first protruding portion P1 may be surrounded along an inner side of the support frame SF.

The first cross-section S1 of the first protruding portion P1 may have a tapered shape. The first protruding portion P1 may have a shape inclined toward the first opening OP1, but is not limited thereto.

The second protruding portion P2 may overlap at least a portion of a second edge E2. The second protruding portion P2 may surround an outer side of the support frame SF along the second edge E2. The second protruding portion P2 may have a rectangular shape in a cross-section, and the cross-sectional shape of the second protruding portion P2 may be variously changed.

The support frame SF may include a recess portion R1 positioned between the first protruding portion P1 and the second protruding portion P2. The support frame SF may include a main body MB, and the first protruding portion P1 and the second protruding portion P2 protruded from the main body MB. The main body MB exposed between the first protruding portion P1 and the second protruding portion P2 may form a recess portion R1.

The main body MB, the first protruding portion P1, and the second protruding portion P2 may be integral with each other, but are not limited thereto. The main body MB and the first protruding portion P1 may be integral with each other, and the second protruding portion P2 may be separately coupled. In other embodiments, the first protruding portion P1 and the second protruding portion P2 may be separately coupled to the main body MB.

Referring to FIG. 5, a support frame SF may include a main body MB, and a first protruding portion P1 and a second protruding portion P2 protruded from the main body MB.

The first protruding portion P1 may be positioned along a first edge E1. The first protruding portion P1 may be surrounded along an inner side of the support frame SF. The first protruding portion P1 may overlap the entire first edge E1 of the support frame SF.

The second protruding portion P2 may overlap at least a portion of a second edge E2. The second protruding portion P2 may overlap vertical sides V1 and V2 of the support frame SF. The second protruding portion P2 may not overlap the horizontal sides H1 and H2 of the support frame SF.

The support frame SF may include a recess portion R1 positioned between the first protruding portion P1 and the second protruding portion P2. The recess portion R1 may be formed on vertical sides V1 and V2 of the support frame SF on which the second protruding portion P2 may be disposed.

Horizontal sides H1 and H2 of the support frame SF may not include the second protruding portion P2. Horizontal sides H1 and H2 of the support frame SF may include only the main body MB and the first protruding portion P1 protruded from the main body MB.

Referring to FIG. 6, a support frame SF may include a main body MB, and a first protruding portion P1 and a second protruding portion P2 protruded from the main body MB.

The first protruding portion P1 may be positioned along a first edge E1. The first protruding portion P1 may be surrounded along an inner side of the support frame SF. The first protruding portion P1 may overlap the entire first edge E1 of the support frame SF.

The second protruding portion P2 may overlap a portion of a second edge E2. The second protruding portion P2 may overlap a portion of both vertical sides V1 and V2 of the second edge E2. The second protruding portion P2 may be positioned to overlap the center of the vertical sides V1 and V2, and may not overlap the ends of the vertical sides V1 and V2. The position of the second protruding portion P2 is not limited thereto. The second protruding portion P2 may not overlap the horizontal sides H1 and H2 of the second edge E2.

The support frame SF may include a recess portion R1 positioned between the first protruding portion P1 and the second protruding portion P2. The recess portion R1 may be formed on a portion of the vertical sides V1 and V2 of the support frame SF to be disposed of the second protruding portion P2.

Horizontal sides H1 and H2 of the support frame SF may not include the second protruding portion P2. The horizontal sides H1 and H2 of the support frame SF may include only the main body MB and the first protruding portion P1 protruded from the main body MB.

According to an embodiment, the second protruding portion P2 may overlap at least a part of the support frame SF. The second protruding portion P2 may be formed only in a region having a large rolling force applied on the support frame SF.

Referring to FIG. 7, stress may be concentrated in a region marked in blue in the support frame SF. Since the second protruding portion P2 may be disposed in the region where the stress may be concentrated, the stress can be distributed and the deformation of the shape of the support frame SF can be prevented.

Figure 8:
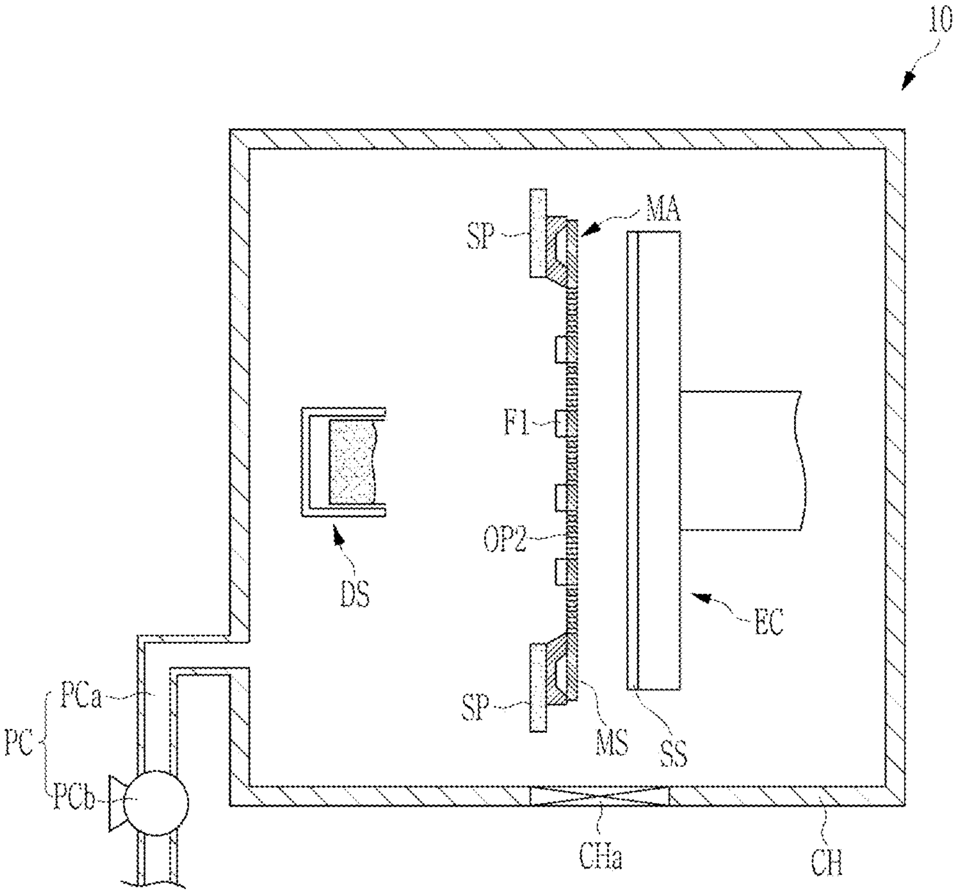
FIG. 8 is a schematic view of a deposition device for a display device.
Figure 9:
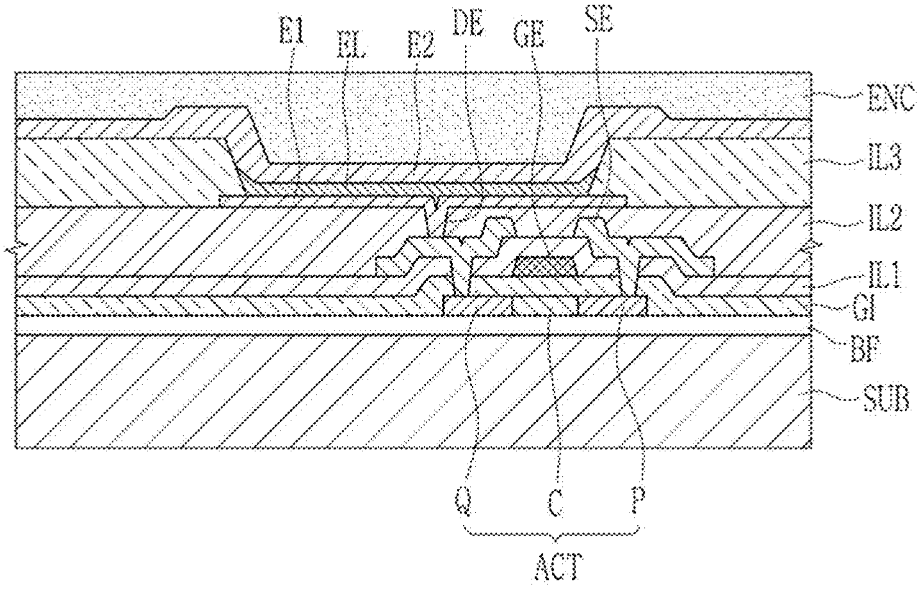
FIG. 9 is a schematic cross-sectional view of a display device manufactured by using the deposition device for the display device of FIG. 8.

Hereinafter, referring to FIG. 8 to FIG. 9, a deposition apparatus for a display device according to an embodiment and a display device manufactured using the deposition apparatus will be described. FIG. 8 is a schematic view of a deposition apparatus for a display device, and FIG. 9 is a schematic cross-sectional view of a display device manufactured by using the deposition apparatus for the display device of FIG. 8.

Referring to FIG. 8, a deposition apparatus for a display device may include a mask assembly MA, a chamber CH, a supporter SP, a deposition source DS, and an electrostatic chuck EC. The mask assembly MA may be the mask assembly shown in FIG. 1. Hereinafter, a detailed description will be omitted.

The chamber CH may have a space formed therein, and a part may be opened. A valve CHa and the like may be installed in an open part of the chamber CH to open and close the open part.

The supporter SP may be seated with the mask assembly MA. The supporter SP may rotate or linearly move the mask assembly MA.

The deposition source DS may be vaporized or sublimed with a deposition material inserted therein. The vaporized or sublimed deposition material may be deposited on a display substrate SS through the mask sheet MS.

The electrostatic chuck EC may align the display substrate SS to the mask assembly MA. The electrostatic chuck EC may absorb the display substrate SS using electromagnetic force and align it on the mask assembly MA. Although the specification shows and describes an embodiment in which the electrostatic chuck EC may be included, it is not limited thereto and any member mounting the display substrate SS may be used.

The deposition apparatus 10 for a display device may deposit a deposition material on the display substrate SS while supporting the display substrate SS in a vertical direction. As another embodiment, it may also be possible to deposit a deposition material on the display substrate SS by moving the display substrate SS and the deposition source DS relative to each other. However, hereinafter, for better comprehension and ease of description, the case of depositing the deposition material on the display substrate SS while supporting the display substrate SS in the vertical direction will be described.

A pressure control portion PC may be connected to the chamber CH. The pressure control portion PC may include a connection pipe PCa connected to the chamber CH, and a pump PCb installed in the connection pipe PCa.

The deposition apparatus 10 for a display device may form an organic layer, an inorganic layer, or a metal layer. Hereinafter, for better comprehension and ease of description, a case in which the deposition apparatus 10 for a display device forms an organic layer will be described. In particular, the case of forming an emission layer among the organic layers will be described in detail below.

In operation of the deposition apparatus 10 for a display device, the display substrate SS and mask assembly MA may be loaded into the chamber CH from the outside and supported in the deposition apparatus 10. The display substrate SS and mask assembly MA may be disposed in the vertical direction with respect to a bottom surface of the chamber CH.

The mark substrate SS and mask assembly MA may be aligned by using the electrostatic chuck EC. The electrostatic chuck EC may adsorb the display substrate SS and mask assembly MA using electromagnetic force.

After aligning the positions of the mask assembly MA and the display substrate SS, the deposition material may be vaporized or sublimated by operating the deposition source DS. The deposition material may be deposited on the display substrate SS through an opening of the mask sheet MS. After that, the display substrate SS on which the deposition may be completed may be drawn out to the outside of the chamber CH to perform the following process.

The mask assembly MA according to an embodiment may be provided vertically when used in the deposition apparatus for a display device. In case that a mask assembly with a weight is provided vertically, deflection or deformation of the mask assembly may occur. However, the mask assembly MA according to an embodiment can prevent the deformation of the mask frame MF by including the first protruding portion P1 positioned on the inner side of the support frame SF and the second protruding portion P2 positioned on the outer side of the support frame SF. Thus, precise alignment of the mask assembly may be possible, and accordingly, a fine pattern can be formed.

Hereinafter, a display panel formed by using the deposition apparatus for a display device of FIG. 8 will be described with reference to FIG. 9. FIG. 9 is a cross-sectional view of a display panel according to an embodiment.

Referring to FIG. 9, a substrate SUB may include an inorganic insulating material such as glass or an organic insulating material such as plastic such as polyimide (PI). The substrate SUB may be single-layered or multi-layered. The substrate SUB may have a structure in which at least one base layer containing a sequentially stacked polymer resin and at least one inorganic layer may be alternately stacked on each other.

The substrate SUB may have various degrees of flexibility. The substrate SUB may be a rigid substrate or a flexible substrate capable of bending, folding, or rolling.

The buffer layer BF may be positioned on the substrate SUB. The buffer layer BF may block transmission of impurities from the substrate SUB to an upper layer of the buffer layer BF, particularly a semiconductor layer (ACT), thereby preventing characteristic degradation of the semiconductor layer ACT and reducing stress. The buffer layer BF may include an inorganic insulating material or an organic insulating material such as a silicon nitride or a silicon oxide. A part or all of the buffer layer BF may be omitted.

The semiconductor layer ACT may be positioned on the buffer layer BF. The semiconductor layer ACT may include at least one of a polysilicon and an oxide semiconductor. The semiconductor layer ACT may include a channel region C, a first region P, and a second region Q. The first region P and the second region Q may be respectively disposed on sides of the channel region C. The channel region C may include a semiconductor doped with a small amount of an impurity or undoped with an impurity, and the first region P and second region Q may be semiconductors doped with a large amount of an impurity compared to the channel region C. The semiconductor layer ACT may be formed of an oxide semiconductor. A separate protective layer (not shown) may be added to protect the oxide semiconductor material, which may be vulnerable to external environments such as a high temperature.

A gate insulation layer GI may be positioned on the semiconductor layer ACT.

A gate electrode GE may be positioned on the gate insulation layer GI. The gate electrode GE may be a single layer or a multilayer in which a metal film including at least one of copper (Cu), a copper alloy, aluminum (Al), an aluminum alloy, molybdenum (Mo), a molybdenum alloy, titanium (Ti), and a titanium alloy may be laminated. The gate electrode GE may overlap the channel region C of the semiconductor layer ACT.

The first interlayer insulation layer IL1 may be positioned on the gate electrode GE and the gate insulation layer GI. The gate insulation layer GI and the first interlayer insulation layer IL1 may be a single layer or multi-layered including at least one of a silicon oxide ($SiO_x$), a silicon nitride (SiNO, and a silicon oxynitride ($SiO_xN_y$).

A source electrode SE and a drain electrode DE may be positioned on the first interlayer insulation layer IL1. The source electrode SE and the drain electrode DE may be respectively connected to the first region P and the second region Q of the semiconductor layer ACT through contact holes formed in the insulation layers.

The source electrode SE and the drain electrode DE may be a single-layer or multi-layer structure including aluminum (Al), silver (Ag), magnesium (Mg), gold (Au), nickel (Ni), chromium (Cr), nickel (Ni), calcium (Ca), molybdenum (Mo), titanium (Ti), tungsten (W), and/or copper (Cu).

A second interlayer insulation layer IL2 may be positioned on the first interlayer insulation layer ILL the source electrode SE, and the drain electrode DE. The second interlayer insulation layer IL2 may include an organic insulation material such as a general-purpose polymer such as polymethyl methacrylate (PMMA) or polystyrene (PS), polymer derivatives with phenolic groups, acryl-based polymers, imide-based polymers, polyimides, acryl-based polymers, siloxane-based polymers, and the like, or a combination thereof.

A first electrode E1 may be positioned on the second interlayer insulation layer IL2. The first electrode E1 may be connected to the drain electrode DE through a contact hole of the second interlayer insulation layer IL2.

The first electrode E1 may include a metal such as silver (Ag), lithium (Li), calcium (Ca), aluminum (Al), magnesium (Mg), gold (Au), or a combination thereof, and may include a transparent conductive oxide (TCO) such as an indium tin oxide (ITO) or an indium zinc oxide (IZO). The first electrode E1 may be formed of a single layer including a metallic material or a transparent conductive oxide, or a multi-layer including a metallic material and/or a transparent conductive oxide. For example, the first electrode E1 may have a triple layer structure of indium tin oxide (ITO)/silver (Ag)/indium tin oxide (ITO).

A transistor formed of the gate electrode GE, the semiconductor layer ACT, the source electrode SE, and the drain electrode DE may be connected to the first electrode E1 to supply current to a light emitting element.

A partitioning wall IL3 may be positioned on the second interlayer insulation layer IL2 and the first electrode E1. Although not shown, a spacer (not shown) may be positioned on the partitioning wall IL3. The partitioning wall IL3 may overlap at least a portion of the first electrode E1 and may have a partitioning wall opening defining a light emitting region.

The partitioning wall IL3 may include an organic insulation material such as a general-purpose polymer such as polymethyl methacrylate (PMMA) or polystyrene (PS), polymer derivatives with phenolic groups, acryl-based polymers, imide-based polymers, polyimides, acryl-based polymers, siloxane-based polymers, and the like, or a combination thereof.

An emission layer EL may be positioned on the partitioning wall IL3. The emission layer EL may be formed using the above-described deposition apparatus 10 for a display device.

The second electrode E2 may be positioned on the emission layer EL. The second electrode E2 may include a reflective metal including calcium (Ca), barium (Ba), magnesium (Mg), aluminum (Al), silver (Ag), gold (Au), nickel (Ni), chromium (Cr), lithium (Li), calcium (Ca), and the like, or a combination thereof or a transparent conductive oxide (TCO) such as an indium tin oxide (ITO) or an indium zinc oxide (IZO).

Here, the first electrode E1 may be an anode that may be a hole injection electrode, and the second electrode E2 may be a cathode that may be an electron injection electrode. However, embodiments are not limited thereto, and depending on a driving method of a light emitting display device, the first electrode E1 may become a cathode and the second electrode E2 may become an anode.

An encapsulation layer ENC may be positioned on the second electrode E2. The encapsulation layer ENC may cover and seal not only a top surface of the light emitting element, but also side surfaces of the light emitting element. Since the light emitting element may be very vulnerable to moisture and oxygen, the encapsulation layer ENC may seal the light emitting element to block the inflow of external moisture and oxygen.

The encapsulation layer ENC may include layers, among which it may be formed as a composite film including both an inorganic layer and an organic layer. For example, may be formed as a triple layer in which the first encapsulation layer, the encapsulation organic layer, and the second encapsulation inorganic layer may be sequentially formed.

Figure 10:
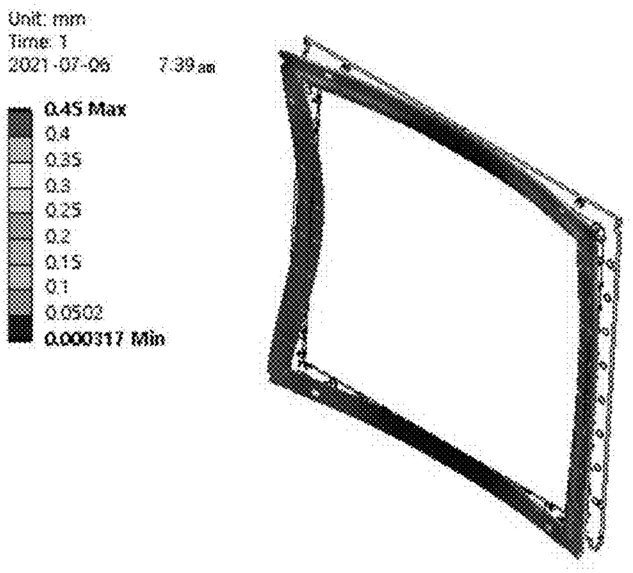
FIG. 10 is a schematic simulation image of a mask frame according to a comparative example.

Hereinafter, mask frames according to a comparative example and an embodiment will be described with reference to FIG. 10 and FIG. 11. FIG. 10 is a schematic simulation image of a mask frame according to a comparative example, and FIG. 11 is a schematic simulation image of the mask frame according to an embodiment.

Referring to FIG. 10, in case that the mask frame according to an embodiment is aligned for vertical deposition, a maximum deformation amount of the support frame may be about 449 micrometers at both ends.

Figure 11:
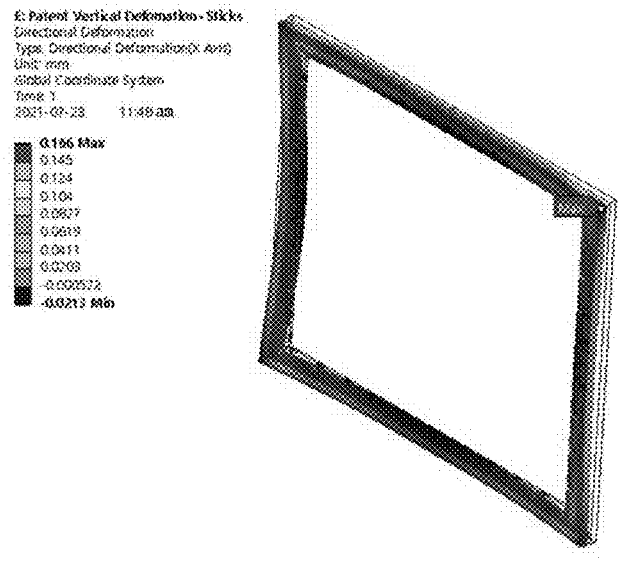
FIG. 11 is a schematic simulation image of a mask frame according to an embodiment.

On the contrary, as shown in FIG. 11, in case that a mask frame including a second protruding portion is aligned for vertical deposition, a maximum deformation amount of the support frame may be reduced by about 60% or more to about 166 micrometers.

The mask assembly MA according to an embodiment may be provided vertically when used in the deposition apparatus for a display device. In case that the mask assembly with a weight is provided vertically, deflection or deformation of the mask assembly may occur. However, the mask assembly MA according to an embodiment may prevent the deformation of the mask frame MF by including the first protruding portion P1 positioned on the inner side of the support frame SF and the second protruding portion P2 positioned on the outer side of the support frame SF. Thus, precise alignment of the mask assembly may be possible, and accordingly, a fine pattern can be formed.

While this disclosure has been described in connection with what is considered to be practical embodiments, it is to be understood that the disclosure is not limited to the disclosed embodiments. On the contrary, it is intended to cover various modifications and equivalent arrangements included within the spirit and scope of the disclosure.

What is claimed is:

1. A mask assembly comprising:
a support frame including at least four sides;
a first frame disposed on the support frame and extending in a first direction;
a second frame disposed on the support frame and extending in a second direction intersecting the first direction; and
a mask sheet disposed on the support frame and including at least one opening,
wherein at least one of the at least four sides of the support frame includes:
a first protruding portion disposed at a first edge of the side;
a second protruding portion disposed at a second edge of the side; and
a recess portion disposed between the first protruding portion and the second protruding portion,
wherein, in a cross-sectional view, the first protruding portion has an outer surface inclined toward an opening of the support frame, and wherein the second protruding portion has an inner surface,
wherein, in the cross-sectional view, the outer surface extends from the recess portion to an upper surface of the first protruding portion in a first inclination direction, and the inner surface of the second protruding portion extends from the recess portion to an upper surface of the second protruding portion in a second inclination direction, and
wherein the first inclination direction forms a first obtuse angle with respect to the recess portion, and the second inclination direction forms a second obtuse angle with respect to the recess portion.

2. The mask assembly of claim 1, wherein
the first edge is an inner side of the support frame, and the second edge is an outer side of the support frame.

3. The mask assembly of claim 1,
wherein the at least one of the at least four sides includes four sides, and
wherein the first protruding portion surrounds an inner side of the support frame.

4. The mask assembly of claim 3, wherein the second protruding portion is disposed on at least a part of an outer side of the support frame.

5. The mask assembly of claim 4, wherein the second protruding portion is disposed on two of the four sides of the support frame, facing each other.

6. The mask assembly of claim 4, wherein the second protruding portion is disposed on at least a part of two of the four sides of the support frame, facing each other.

7. The mask assembly of claim 1, wherein, in the cross-sectional view, the first protruding portion and the second protruding portion have a tapered surface.

8. The mask assembly of claim 1, wherein the mask assembly is configured to be used in a vertical deposition process.

9. The mask assembly of claim 1, wherein, in the cross-sectional view, an inner surface of the first protruding portion extends from a bottom surface of the support frame towards the upper surface of the first protruding portion in a third inclination direction that is not parallel to the first inclination direction.

10. The mask assembly of claim 9, wherein the third inclination direction forms a third obtuse angle with the bottom surface of the support frame.

11. A deposition apparatus for a display device, comprising:

a chamber in which a display substrate is disposed;

a mask assembly opposite to the display substrate in the chamber; and a deposition source opposite to the mask assembly in the chamber, wherein the mask assembly comprises:

a support frame that includes at least four sides;

a first frame disposed on the support frame and extending in a first direction;

a second frame disposed on the support frame and extending in a second direction intersecting the first direction; and a mask sheet disposed on the support frame and including at least one opening, and at least one of the four sides of the support frame includes:

a first protruding portion disposed at a first edge of the side;

a second protruding portion disposed at a second edge of the side; and a recess portion disposed between the first protruding portion and the second protruding portion, wherein, in a cross-sectional view, the first protruding portion has an outer surface inclined toward an opening of the support frame, and wherein the second protruding portion has an inner surface, wherein, in the cross-sectional view, the outer surface extends from the recess portion to an upper surface of the first protruding portion in a first inclination direction, and the inner surface of the second protruding portion extends from the recess portion to an upper surface of the second protruding portion in a second inclination direction, and wherein the first inclination direction forms a first obtuse angle with respect to the recess portion, and the second inclination direction forms a second obtuse angle with respect to the recess portion.

12. The deposition apparatus of claim 11, wherein the mask assembly is disposed vertically in the chamber.

13. The deposition apparatus of claim 11, wherein the first edge is an inner side of the support frame, and the second edge is an outer side of the support frame.

14. The deposition apparatus of claim 11, wherein the at least one of the at least four sides includes four sides, and wherein the first protruding portion surrounds an inner side of the support frame.

15. The deposition apparatus of claim 14, wherein the second protruding portion is disposed on at least a part of an outer side of the support frame.

16. The deposition apparatus of claim 15, wherein the second protruding portion is disposed on two of the four sides of the support frame, facing each other.

17. The deposition apparatus of claim 15, wherein the second protruding portion is disposed on at least a part of two of the four sides of the support frame, facing each other.

18. The deposition apparatus of claim 11, wherein, in the cross-sectional view, the second protruding portion has a tapered surface.

19. The deposition assembly of claim 11, wherein, in the cross-sectional view, an inner surface of the first protruding portion extends from a bottom surface of the support frame towards the upper surface of the first protruding portion in a third inclination direction that is not parallel to the first inclination direction.

20. The deposition assembly of claim 19, wherein the third inclination direction forms a third obtuse angle with the bottom surface of the support frame.

* * * * *